Sept. 22, 1970 I. J. HIRST 3,530,392

NEGATIVE FEEDBACK AMPLIFIERS

Filed Aug. 21, 1968

United States Patent Office 3,530,392

Patented Sept. 22, 1970

3,530,392
NEGATIVE FEEDBACK AMPLIFIERS

Ian Johnson Hirst, Charlton, London, England, assignor to International Standard Electric Corporation, New York, N.Y., a corporation of Delaware Filed Aug. 21, 1968, Ser. No. 754,289
Claims priority, application Great Britain, Sept. 7, 1967, 40,949/67
Int. Cl. H03f *1/34*; H03g *3/30*
U.S. Cl. 330—28 3 Claims

ABSTRACT OF THE DISCLOSURE

To reduce the effect of overload on negative feedback amplifiers a stage in the forward path of the amplifier is provided with local negative feedback. The magnitude of this feedback is made amplitude dependent by connecting a non-linear element (a pair of diodes connected in parallel opposition) between the collector and base of a transistor stage thereby providing shunt feedback. The residual non-linear distortions are reduced by overall negative feedback threshold of the diodes set so that local negative feedback is produced only when signals exceed a predetermined level.

This invention relates to negative feedback amplifiers and in particular to means for reducing distortions in such amplifiers.

The use of negative fedback as a means to reduce distortion introduced by electric amplifiers is well known. However when the amplitude of the input signals is sufficiently large to overload an amplifier stage, a negative feedback amplifier may introduce more distortion than an amplifier without feedback at the same output level. See for example article "Negative Feedback and Non-Linearity by Cathode Ray" in Wireless World, April 1961, p. 225.

To alleviate this difficulty it is known to use in the circuit preceding the amplifier a compressor or limiter circuit. While this solution may be permissible in some applications it cannot be used in wide band long distance telecommunication systems involving many repeaters on account of the distortions introduced by such devices.

It is therefore an object of the invention to include in a negative feedback amplifier circuit means to make it less sensitive to overload.

According to the invention there is provided a negative feedback amplifier for electric signals comprising a forward gain path having at least two amplifying stages, an overall negative feedback path connected between the output and input of said forward gain path, a means in said forward gain path to sense the instantaneous amplitude of the signal and means to alter the gain of said forward gain path as a function of said amplitude thereby altering the loop gain of the amplifier without substantially altering its through gain.

Figure 1:
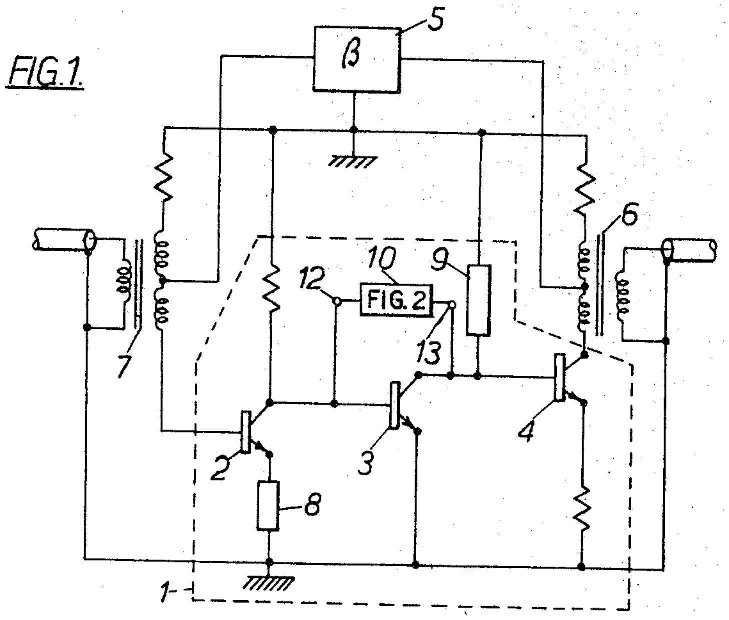
Figures 2, 3:
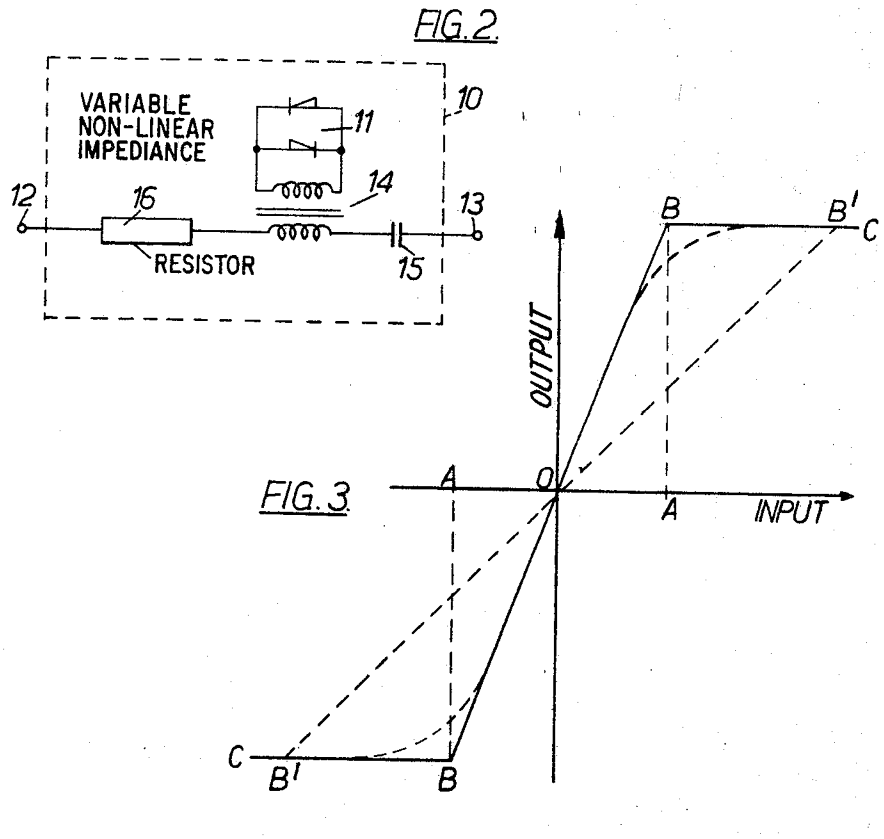

The invention will now be described with reference to the figures of the accompanying drawings in which:

FIG. 1 is a schematic of an amplifier according to an embodiment of the invention, FIG. 2 shows a circuit detail of FIG. 1, and FIG. 3 are characteristic curves used to explain the operation of the amplifier.

The amplifier shown in FIG. 1 comprises a gain path indicated by the dowled box 1 including transistors 2, 3 and 4 and an overall negative feedback path represented by the $\beta$ network 5. This latter is connected between a tap on the primary of output transformer 6 and a tap on the secondary of input transformer 7. The gain path includes impedance networks 8 and 9. The shape of the through gain-frequency response of the amplifier is determined by the characteristic of the feedback network $\beta$. Impedance networks 8 and 9 are provided to shape the characteristic of the $\mu$ path in order to ensure stability of the amplifier.

The second stage 3 of the amplifier is provided with local negative feedback indicated by network 10 connected between the collector and the base of transistor 3. As shown in FIG. 2 network 10 consists of a pair of opposedly poled diodes 11 which is connected to the terminals 12 and 13 via transformer 14, a blocking capacitor 15 and impedance 16.

It is apparent that the voltage appearing between terminals 12 and 13 of the network 10 is a function of the instantaneous magnitude of the signal in the gain path and that the gain of the second amplifying stage is a function of the magnitude of impedance of network 10. Due to the non-linear characteristic of the diodes. The impedance presented by the network 10 will decrease with increasing voltage. As a result the amount of local negative feedback will increase with increasing amplitude.

The impedance inserted in the path 12 to 13 by the primary of the transformer 14 is a function of the impedance connected across its secondary winding. This connected impedance is the impedance of the diodes 11 and is a function of the bias, if any, and the instantaneous value of the signal applied by the secondary winding to the diodes. The transformer ratio therefore governs the impedance presented by the diodes to any given signal applied to the path 12 and 13.

The rate of change of local feedback with signal level can be set by suitable choice of impedance 16, the rate of change decreasing as the impedance is increased. In general impedance 16 will be a resistor. However reactive elements may be included if it is desired to make the local feedback frequency dependent. Since the knee of the forward characteristic of the diodes is offset with respect to the origin, the diodes remain inoperative so long as the signal in the gain path remains below a certain level. This threshold of operation can be set to a required value by either changing the turns ratio of transformer 14 or arranging to apply a suitable biassing potential to the diodes.

The operation of the circuit will now be described with reference to FIG. 3 which shows a typical input-output characteristic of an amplifier. Provided the input signals remain below the value OA, the amplifier will be operated over the linear portion OB of its characteristic curve and proportionality between the input and output signals will be maintained. Since the maximum undistorted output power in a correctly designed amplifier is fixed and given by the power handling capacity of the output stage, input signals which exceed value OA will be clipped by the horizontal portion BC of the characteristic curve and will generate spurious frequencies. If the gain of the amplifier were reduced to a value represented, for example by the line OB′ of the characteristic curve then overloading of the last stage is avoided and no spurious signals would be generated.

It is thus apparent that the amount of distortion caused by a non-linear characteristic increases as the curvature of the characteristic curve increases. It is of course impossible to design an amplifier having a linear input-output characteristic the slope of which is altered by the amplitude of the signal. The best that can be done is to vary the gain of the amplifier as a function of the instantaneous magnitude of the signal. In that case the input-output characteristic of the amplifier will be a smooth curve such as represented by curved line connecting points O and B′ in FIG. 2 and it is apparent that the distortion introduced by such a characteristic will be less than the distortion introduced by a characteristic represented by line OBB'.

In general it will be arranged either by selecting an appropriate turns ratio of transformer 14 or by applying suitable bias potentials to the diodes 11 that the local feedback of stage 3 is inhibited when the amplitude of the signals is less than a stated value. The forward gain path of the amplifier is at its maximum value when the negative feedback is minimum. When the signal amplitude exceeds the stated value, then the local negative feedback will reduce the gain of the gain path. The non-linear distortions resulting from the instantaneous reduction of gain will however be less than if the gain of the gain path were left at its maximum value. These residual non-linear distortions in the gain path and the variations in gain of that path are reduced by the overall feedback loop containing the $\beta$ network.

Although the invention was described with reference to a three stage transistor amplifier the invention is not limited to such amplifiers and is applicable to other known arrangements of negative feedback amplifiers including those using valves.

What is claimed is:

1. A negative feedback amplifier comprising a forward gain path having at least a first and a last amplifying stage, each of said stages comprising a transistor connected in the common emitter mode, an overall negative feedback path connected between the output of said last stage and the input of said first stage, a local feedback path connected between the output and the input of one of said transistors, said local feedback path comprising a device having a non-linear voltage-current characteristic which is symmetrical with respect to zero volts, said device comprising a transformer, said transformer having a primary winding serially connected in said local feedback path, a secondary winding inductively coupled to said primary winding, a pair of diodes connected in parallel opposition with each other and bridging said secondary winding, and the ratio of turns between said primary winding and said secondary winding being such that said diodes are in their non-conductive state until a certain predetermined amplitude of signal is received at the input to said local feedback circuit.

2. The amplifier of claim 1 wherein said amplifier comprises three stages, and wherein said local feedback circuit extends from the output of said second stage to the input of said second stage.

3. The negative feedback amplifier of claim 2 wherein resistor means are serially connected with said main winding in said local feedback path, a value of said resistor means being chosen to provide a desired rate of change in said local feedback circuit.

References Cited

UNITED STATES PATENTS

| | | | |
|---|---|---|---|
| 2,215,777 | 9/1940 | Benz | 330—110 X |
| 3,036,224 | 5/1962 | Abraham | 330—28 X |
| 3,041,535 | 6/1962 | Cochran | 330—110 X |
| 3,252,007 | 5/1966 | Saari | 330—28 X |
| 3,368,158 | 2/1968 | Brown | 330—29 X |

ROY LAKE, Primary Examiner

J. B. MULLINS, Assistant Examiner

U.S. Cl. X.R.

330—29, 110